United States Patent
Sakamoto et al.

(10) Patent No.: US 8,586,214 B2
(45) Date of Patent: Nov. 19, 2013

(54) CUTTING TOOL

(75) Inventors: Yoshiki Sakamoto, Satsumasendai (JP); Masahiro Waki, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/638,549

(22) PCT Filed: Mar. 28, 2011

(86) PCT No.: PCT/JP2011/057628
§ 371 (c)(1),
(2), (4) Date: Oct. 1, 2012

(87) PCT Pub. No.: WO2011/122554
PCT Pub. Date: Oct. 6, 2011

(65) Prior Publication Data
US 2013/0022419 A1    Jan. 24, 2013

(30) Foreign Application Priority Data

Mar. 29, 2010 (JP) ................. 2010-074582
Jun. 29, 2010 (JP) ................. 2010-147743

(51) Int. Cl.
*B32B 9/00*    (2006.01)
(52) U.S. Cl.
USPC ............... 428/697; 51/307; 51/309; 428/698; 428/699
(58) Field of Classification Search
USPC ................. 51/307, 309; 428/697, 698, 699
See application file for complete search history.

(56) References Cited

U.S. PATENT DOCUMENTS

| | | | |
|---|---|---|---|
| 6,767,658 B2 * | 7/2004 | Yamamoto et al. | 428/698 |
| 7,056,602 B2 * | 6/2006 | Horling et al. | 428/697 |
| 7,083,868 B2 * | 8/2006 | Horling et al. | 51/309 |
| 7,521,131 B2 * | 4/2009 | Yamamoto | 428/699 |
| 7,811,683 B2 * | 10/2010 | Zhu et al. | 51/307 |
| 8,062,776 B2 * | 11/2011 | Waki et al. | 428/698 |
| 8,236,411 B2 * | 8/2012 | Waki et al. | 428/697 |
| 2002/0176753 A1 | 11/2002 | Kato | |
| 2008/0075543 A1 | 3/2008 | Zhu et al. | |

FOREIGN PATENT DOCUMENTS

| | | | |
|---|---|---|---|
| JP | 09-323204 | * | 12/1997 |
| JP | 10-251831 | * | 9/1998 |
| JP | 11-302831 | * | 11/1999 |
| JP | 2002-346812 | | 12/2002 |
| JP | 2005-111574 | * | 4/2005 |
| JP | 2005-199420 | | 7/2005 |
| JP | 2007-46103 | | 2/2007 |
| JP | 2008-264975 | | 11/2008 |
| JP | 2009-50997 | | 3/2009 |
| JP | 2009-66673 | | 4/2009 |

* cited by examiner

*Primary Examiner* — Archene Turner
(74) *Attorney, Agent, or Firm* — Schlee IP International, P.C.; Alexander R. Schlee

(57) ABSTRACT

A cutting tool with excellent resistance to adhesion and wear. The cutting tool has a cutting edge on the intersecting ridge line of the rake face and the flank face, and is covered on the surface of the base thereof by a coating layer comprising $Ti_aAl_bNb_dM_e(C_{1-x}N_x)$. M is at least one selected from Si, W, Mo, Ta, Hf, Cr, Zr, and Y, with the content ranges $0.3 \leq a \leq 0.8$, $0 \leq b \leq 0.6$, $0.01 \leq d \leq 0.25$, $0 \leq e \leq 0.25$, $a+b+d+e=1$, and $0 \leq x \leq 1$). Droplets provided on the surface of the coating layer have a higher Nb content ratio on the rake face compared to the flank face.

8 Claims, 1 Drawing Sheet

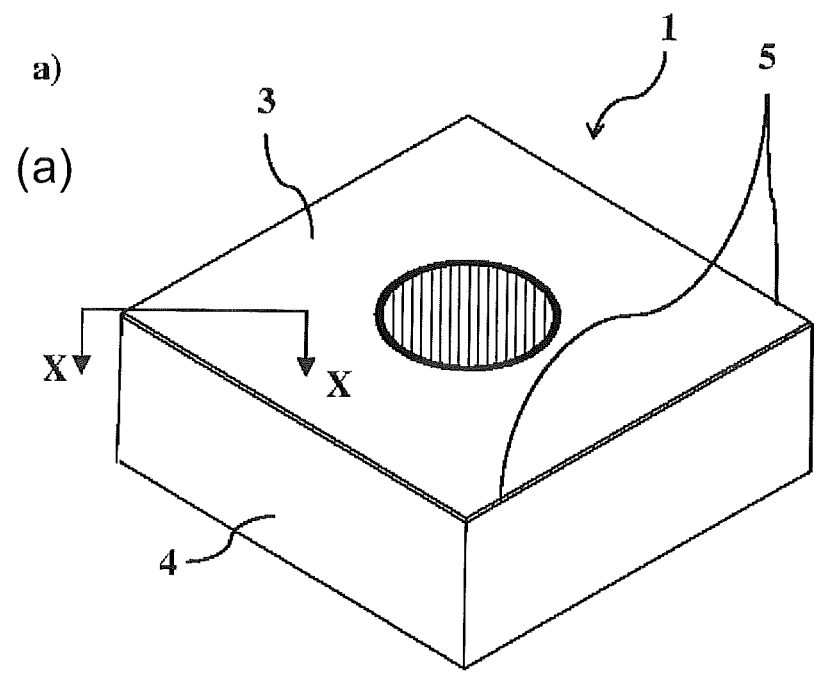
(a)
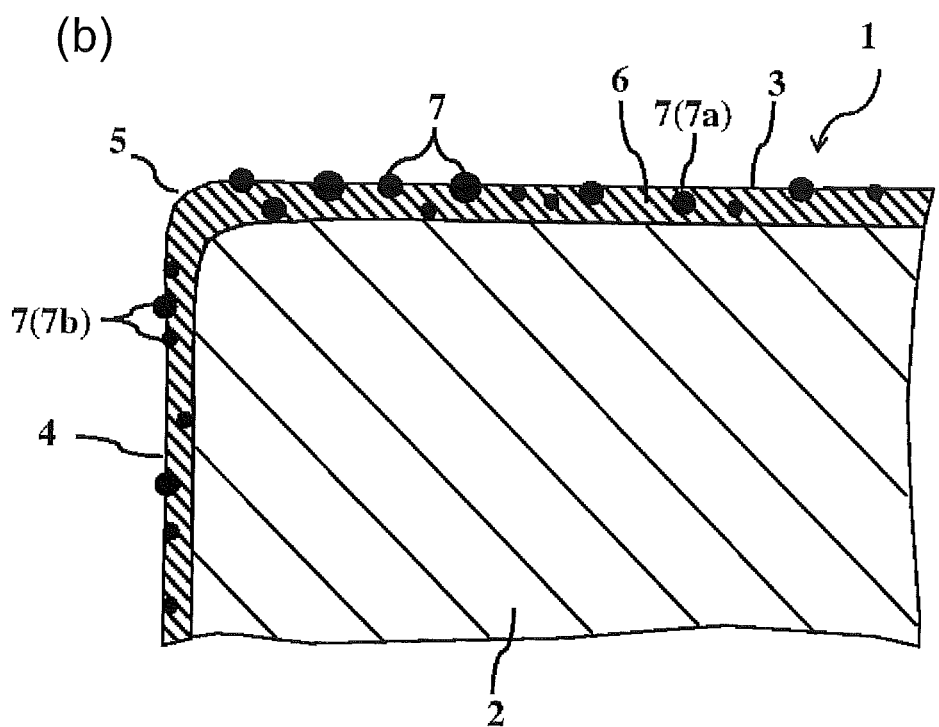
(b)

CUTTING TOOL

TECHNICAL FIELD OF THE INVENTION

The present invention relates to a cutting tool in which a coating layer is formed on surfaces of a substrate.

BACKGROUND OF THE INVENTION

Presently, as for members, which are required to exhibit wear resistance, sliding properties, and fracture resistance, such as cutting tools, wear-resistant members, and sliding members, wear resistance, sliding properties, and fracture resistance are enhanced by using a technique of forming a coating layer on surfaces of a substrate composed of a sintered alloy such as a cemented carbide, cermet, or the like, a high-hardness sintered body such as diamond or cBN (cubic boron nitride), or a ceramic such as alumina, silicon nitride, or the like.

Extensive studies have been conducted on methods for forming coating layers in which a physical vapor deposition process such as an arc ion plating process or a sputtering process is used to form nitride layers containing Ti or Al as a main component, and continuous improvements have been made to extend tool life. Various innovations other than elements used in the coating materials have been applied to these surface-coated tools having coating layers in order to comply with changes in cutting environment such as increasing cutting speeds and diversification of workpieces.

For example, PTL 1 describes a surface-coated tool in which surfaces of a substrate are coated with a coating film such as TiAlN and that progress of welding and wear at a rake face can be suppressed and notch wear at a flank face can be suppressed by making the Ti ratio in the flank face higher than the that in the rake face.

PTL 2 describes formation of a TiAlN-based hard coating film having a thickness of 1 to 5 μm on surfaces of a substrate, and describes that the hard coating film exhibits improved welding resistance and wear resistance by making coarse particles, which are larger than the thickness of the coating film and are present in the hard coating film, 5 area % or less, and by making the surface roughness Ra thereof 0.1 μm or less or the surface roughness Rz 1 μm or less.

PTL 3 discloses formation of a film having a composition such as (TiNbAl)N on surfaces of a substrate to improve wear resistance, and PTL 4 describes a hard-coating film having a composition such as (TiAlNbSi)N in which multiple layers having different contents of Si and Nb are stacked by changing coating processes.

PTL 5 discloses a (Ti,Al,W,Si,M)N coating layer (where M represents at least one element selected from the group consisting of Nb, Mo, Ta, Hf and Y) which exhibits a good oxidation resistance and a good wear resistance.

CITATION LIST

Patent Literature

PTL 1: Japanese Unexamined Patent Application Publication No. 2008-264975
PTL 2: Japanese Unexamined Patent Application Publication No. 2002-346812
PTL 3: Japanese Unexamined Patent Application Publication No. H11-302831
PTL 4: Japanese Unexamined Patent Application Publication No. 2005-199420
PTL 5: Japanese Unexamined Patent Application Publication No. 2009-050997

However, according to the configuration of PTL 1 in which the Ti ratio in the flank face is higher than the Ti ratio in the rake face, the heat resistance and oxidation resistance of the coating layer at the rake face are still insufficient and the fracture resistance at the flank face is also insufficient.

According to the configuration of PTL 2 in which the coarse particles is reduced as much as possible, because the surface roughness is small, chips directly hit the hard film, resulting in an increase in the temperature of the hard film to cause progress of crater wear, and a decrease in wear resistance, which are problems.

Even a composition in which Nb is added to TiAlN as a third metal as described in PTL 3 or PTL 4 improves wear resistance, but further improvement is necessary. Specifically, chipping or breakage caused by adhesion of cutting chips, and the like, or rapid progress of wear due to temperature increase sometimes occurs, and further improvement of wear resistance is desired. As for the cutting tool described in PTL 5, significant welding of cutting chips caused by coarse particles or roughed work surface may occur.

The present invention has been made to solve the problems described above and an object thereof is to provide a cutting tool that includes a coating layer and that can exhibit locally optimum cutting performance.

SUMMARY OF THE INVENTION

A cutting tool according to the present invention includes a cutting edge at a ridgeline between a rake face and a flank face, and includes a coating layer which is coated on surfaces of a substrate and which is composed of $Ti_aAl_bNb_dM_e(C_{1-x}N_x)$ (where M represents at least one element selected from the group consisting of Si, W, Mo, Ta, Hf, Cr, Zr, and Y, $0.3 \leq a \leq 0.8$, $0 \leq b \leq 0.6$, $0.01 \leq d \leq 0.25$, $0 \leq e \leq 0.25$, $a+b+d+e=1$, and $0 \leq x \leq 1$). Droplets exist on a surface of the coating layer, and the average composition of the droplets at the rake face has a higher Nb content than the average composition of the droplets at the flank face.

DETAILED DESCRIPTION OF THE INVENTION

In the above configuration, a number of droplets existing at a rake face may be larger than that of droplets existing at flank face.

In the above configuration, a content ratio of Nb in the coating layer at the rake face may be higher than a content ratio of Nb in the coating layer at the flank face.

Furthermore, the above configuration, the coating layer may be made of $Ti_aAl_bNb_dW_fM_e(C_{1-x}N_x)$ (where M represents at least one element selected from the group consisting of Si, Mo, Ta, Hf, Cr, Zr, and Y $0.35 \leq a \leq 0.55$, $0.3 \leq b \leq 0.6$, $0.01 \leq d \leq 0.2$, $0 \leq e \leq 0.25$, $0 \leq f \leq 0.2$, $a+b+d+e+f=1$, and $0 \leq x \leq 1$), and an average composition of the droplets at the rake face may have a lower W content than an average composition of the coating layer at the flank face.

In addition, the ratio of an average Al content $Al_{DR}$ of the droplets at the rake face to an Al content $Al_{bR}$ of the coating layer at the rake face may be 1.03 5 $Al_{DR}/Al_{bR} \leq 1.25$, and the ratio of an average Ti content $Ti_{DF}$ of the droplets at the flank face to a Ti content $Ti_{aF}$ of the coating layer at the flank face may be $1.03 \leq Ti_{DF}/Ti_{aF} \leq 1.2$.

In addition, $0.07$ μm$\leq Ra_R \leq 0.3$ μm and $0.05$ μm$\leq Ra_F \leq 0.15$ μm, where an arithmetic mean surface roughness of the coating layer at the rake face is $Ra_R$ and an arithmetic mean surface roughness of the coating layer at the flank face is $Ra_F$, and 0.3 µm≤$Rz_R$≤0.9 µm and 0.15 µm≤$Rz_F$≤0.6 µm, where a maximum height surface roughness of the coating layer at the rake face is $Rz_R$, and a maximum height surface roughness of the coating layer at the flank face is $Rz_F$.

In addition, $(Nb_R+W_R)/(Nb_F+W_F)$ may be in a range between 0.9 and 1.1, where ratios of Nb and W with respect to the total amount of Ti and Al in the coating layer at the rake face are respectively $Nb_R$ and $W_R$, and ratios of Nb and W with respect to the total amount of Ti and Al in the coating layer at the flank face are respectively $Nb_F$ and $W_F$.

In addition, the coating layer may have a multilayer structure in which a total of ten or more first coating layers and second coating layers are alternately stacked, the first coating layers being represented by $Ti_{a1}Al_{b1}Nb_{d1}M_{e1}(C_{1-x1}N_{x1})$ (where 0≤a1≤1, 0≤b1≤0.8, 0≤d1≤0.2, 0≤e1≤0.2 and 0≤x1≤1) and the second coating layers being represented by $Ti_{a2}Al_{b2}Nb_{d2}M_{e2}(C_{1-x2}N_{x2})$ (where 0≤a2≤1, 0≤b2≤0.8, 0≤d2≤0.2, 0≤e2≤0.2 and 0≤x2≤1, excluding a1=a2, b1=b2, d1=d2 and e1=e2).

According to a cutting tool of the present invention, droplets are exist on a surface of the coating layer which covers the substrate, even when cutting chips pass on the rake face during cutting, the cutting chips do not directly hit the rake face due to existence of droplets, whereby making a temperature of the surface of the coating layer not so high. In addition, since a Nb content ratio at the rake face is higher than that at the flank face, oxidation resistance of the droplets existing at the rake face is high. Accordingly, droplets do not immediately deteriorate and disappear at the rake face, exert an effect to keep cutting liquid on the surface of the coating layer. In contrast, droplets quickly disappear at the flank face because of low oxidation resistance, thereby improving the finished surface during machining.

BRIEF DESCRIPTION OF THE DRAWINGS

FIG. 1 shows an example of a cutting tool according to the present invention with (a) a schematic perspective view and (b) a cross-sectional view along the line X-X in (a).

DETAILED DESCRIPTION OF THE DRAWINGS

A cutting tool according to a preferable embodiment of the present invention will be described with reference to FIG. 1 ((*a*) is a schematic perspective view, and (*b*) a cross-sectional view along the line X-X in (*a*)).

Referring to FIG. 1, a cutting tool 1 includes a rake face 3 on a major surface, flank faces 4 on side surfaces, cutting edges 5 at the ridgelines between the rake face 3 and the flank faces 4, and has a configuration in which a coating layer 6 is formed on surfaces of a substrate 2.

A coating layer 6 composed of $Ti_aAl_bNb_dM_e(C_{1-x}N_x)$ (where M represents at least one element selected from the group consisting of Si, W, Mo, Ta, Hf, Cr, Zr, and Y, 0.3≤a≤0.8, 0≤b≤0.6, 0.01≤d≤0.25, 0≤e≤0.25, a+b+d+e=1, and 0≤x≤1) is formed on the surfaces of the substrate 2. As shown in FIG. 1(*b*), pieces of particulate matter called droplets 7 exist on the surface of the coating layer 6. An average composition of the droplets 7 existing on the rake face 3 has a higher Nb content ratio than an average composition of the droplets 7 existing at the flank face 4. Hereafter, in some cases the "average compositions of the droplets" is abbreviated to just read "composition of the droplets", and the "average content ratio of the droplets" is abbreviated to just read "content ratio of the droplets".

In this configuration, even when cutting chips pass on the rake face 3 during cutting, the cutting chips do not directly hit the rake face due to existence of droplets, whereby making a temperature of the surface of the coating layer not so high. In addition, since a Nb content ratio at the rake face 3 is higher than that at the flank face 4, oxidation resistance of the droplets 7 existing at the rake face 3 is high, and droplets 7 do not immediately deteriorate and disappear at the rake face 3 to exert an effect to keep cutting liquid on the surface of the coating layer 6. In contrast, droplets 7 quickly disappear at the flank face 4 because of low oxidation resistance, thereby improving the finished surface during machining.

In addition, the number of the droplets 7 is equal to or larger than 0.3 µm in a square aria of 10 µm×10 µm on the rake face 3 is preferably 15 to 50, more preferably 18 to 30 in view of the reduction in heating by passing of the cutting chips. In addition, the number of droplets on the rake face 3 is preferably larger than that on the flank face 4 in view of reduction in heating the rake face 3 by passing of the cutting chips, and of making the surface of the flank face 4 smooth to improve a quality of the finished surface. The average composition of the droplets in the present invention means an average value of compositions of droplets 7 equal to or larger than 0.3 µm in a square aria of 10 µm×10 µm of which are respectively measured and averaged.

In addition, a content ratio of Nb in the coating layer 6 at the rake face 3 is preferably higher than a content ratio of Nb in the coated 6 layer at the flank face 4 to increase oxidation resistance in view of suppression of crater wear and improvement of removal of cutting chips due to the improvement of oxidation resistance.

A coating layer 6 is preferably composed of $Ti_aAl_bNb_dW_f M_e(C_{1-x}N_x)$ (where M represents at least one element selected from the group consisting of Si, Mo, Ta, Hf, Cr, Zr, and Y, 0.35≤a≤0.55, 0.3≤b≤0.6, 0.01≤d≤0.2, 0≤e≤0.25, 0≤f≤0.2, a+b+d+e+f=1, and 0≤x≤1) is formed and W in the composition of the droplets formed at the rake face 3 preferably has a lower W content ratio than the composition of the droplets formed at the flank face 4. That is, as for the composition of the droplets, the composition of the droplets formed at the rake face 3 has higher Nb content ratio and smaller W content ratio of W than the composition of the droplets formed at the flank face 4. Accordingly, droplets formed at the rake face 3 has high content ratio of Nb, thereby causing high hardness and oxidation resistance. Accordingly, since droplets formed on the rake face 3 has high Nb content ratio to cause high hardness and high oxidation resistance, droplets do not immediately wear out despite the contact of chips with the droplets and thus chips do not directly hit the coating layer 6 at the rake face 3. Moreover, because cutting oil penetrates gaps between the coating layer and the chip, the lubricity of the chips is improved. As a result, the temperature elevation of the coating layer 6 at the rake face is suppressed and the crater wear is decreased. In addition, since the droplets 7*b* at the flank face 4 has a larger W content ratio, the fracture toughness is increased, the droplets 7*b* absorbs the impact on the flank face 4 to be able to reduce the impact on the coating layer 6; therefore, the fracture resistance of the coating layer 6 at the flank face 4 can be improved.

When a content ratio $Nb_{DR}$ and $W_{DR}$ of Nb and W of the droplets 7*a* formed on the surface of the rake face 3, and a content ratio $Nb_{DF}$ and $W_{DF}$ of Nb and W of the droplets 7*b* formed on the surface of the flank face 4, respectively, the ratio $Nb_{DR}/Nb_{DF}$ is preferably in a range of 1.07 to 1.25, the ratio $W_{DR}/W_{DF}$ is in a range of 0.75 and 0.9, in view of a balance of the wear resistance at the rake face 3 and the fracture resistance at the flank face 4.

In order to improve the wear resistance and the fructure resistance, $(Nb_R+W_R)/(Nb_F+W_F)$ is preferably in a range of 0.9 to 1.1, where $Nb_r$ and $W_r$ are ratios of Nb and W respectively relative to the total amount of Ti and Al in the coating layer 6 at the rake face 3, and $Nb_F$ and $W_F$ are ratios of Nb and W respectively with respect to the total amount of Ti and Al in the coating layer 6 at the flank face 4.

In this case, an Al content ratio of $Al_{DR}$ of the droplets 7a formed on the surface of the rake face 3 preferably satisfies $1.03 \leq Al_{DR}/Al_{bR} \leq 1.25$ relative to the Al content ratio $Al_{bR}$ of the coating layer 6 at the rake face 3, in order to have high hardness and high wear resistance due to the cubic crystal structure of the droplet 7 as well as improve the heat resistance and the oxidation resistance of the droplet 7a. Particularly, $1.05 \leq Al_{DR}/Al_{bR} \leq 1.15$ is preferable in view of oxidation resistance and wear resistance. Furthermore, a content ratio $Ti_{DF}$ of Ti included in the droplets 7b formed on the flank face 4 preferably satisfies $1.03 \leq Ti_{DF}/Ti_{aF} \leq 1.2$ relative to the content ratio $Ti_{aF}$ of Ti included in the coating layer 6 at the flank face 4, in order to be able to improve the chipping fracture resistance at the flank face 4 for a long period of time without degrading the hardness and heat resistance in addition to improve the fracture toughness of the droplets 7b. Particularly, $1.05 \leq Ti_{DF}/Ti_{aF} \leq 1.12$. is preferable in view of improvement of fracture resistance.

Moreover, the Al content ratio of $Al_{DR}$ of the droplets 7 formed on the surface of the coating layer 6 at the rake face 3 preferably satisfies $0.94 \leq Al_{DR}/Al_{DF} \leq 0.99$ relative to the Al content ratio $Al_{DF}$ of the droplets 7 formed on the surface at the frank face 4, in order to optimize the wear resistance at the rake face 3 and the flank face 4. A particularly preferable range of the ratio $Al_{DR}/Al_{DF}$ is $0.95 \leq Al_{DR}/Al_{DF} \leq 0.99$. Furthermore, a content ratio $Ti_{DF}$ of Ti in the droplets 7 formed on the surface of the coating layer 6 at the rake face 3 preferably satisfies $1.03 \leq Ti_{DR}/Ti_{DF} \leq 1.12$ relative to the content ratio $Ti_{DF}$ of Ti in the droplets 7 formed on the surface at the flank face 4, in order to be able to optimize the fracture resistance both at the rake face 3 and at the flank face 4. A particularly preferable range of the ratio $Al_{DR}/Al_{DF}$ is $1.05 \leq Al_{DR}/Al_{DF} \leq 1.10$.

When the arithmetic mean roughness $Ra_R$ of the coating layer 6 at the rake face 3 is within the range of $0.07 \mu m \leq Ra_R \leq 0.3 \mu m$, the effects of suppressing temperature elevation of the coating layer 6 at the rake face 3 and enhancing the wear resistance are high and the welding resistance can also be improved. When the arithmetic mean roughness $Ra_F$ of the coating layer 6 at the flank face 4 is within the range of $0.05 \mu m \leq Ra_F \leq 0.15 \mu m$, the surface of the workpiece after working can be satisfactorily finished. In order to enhance these effects induced by the presence of the droplets, the maximum height surface roughness $Rz_R$ of the coating layer 6 at the rake face 3 and the maximum height surface roughness $Rz_F$ of the coating layer 6 at the flank face 4 preferably satisfy $0.3 \mu m \leq Rz_R \leq 0.9 \mu m$ and $0.15 \mu m \leq Rz_F \leq 0.6 \mu m$.

The coating layer 6 at the rake face is composed of $Ti_aAl_bNb_dM_e(C_{1-x}N_x)$ (where M represents at least one element selected from the group consisting of Si, Mo, W, Ta, Hf, Cr, Zr, and Y, $0.3 \leq a \leq 0.8$, $0 \leq b \leq 0.6$, $0.01 \leq d \leq 0.25$, $0 \leq e \leq 0.25$, $a+b+d+e=1$, and $0 \leq x \leq 1$). When the coating layer 6 is within this composition range, the oxidation onset temperature of the coating layer 6 rises, the oxidation resistance is increased, the internal stress therein can be reduced, and the fracture resistance is enhanced. Moreover, since the coating layer 6 has high hardness and high adhesion to the substrate 2, the coating layer 6 exhibits good wear resistance and good fracture resistance under severe cutting conditions such as machining of difficult-to-cut materials, dry cutting, and high-speed cutting.

That is, when "a" (Ti content ratio) in the coating layer 6 is smaller than 0.3, the crystal structure of the coating layer 6 changes from cubic to hexagonal, resulting in a decrease in hardness and in wear resistance. When "a" (Ti content ratio) is larger than 0.8, the oxidation resistance and heat resistance of the coating layer 6 are decreased. A particularly preferable range for "a" is $0.35 \leq a \leq 0.55$, and more preferably $0.45 \leq a \leq 0.5$. When "b" (Al content ratio) is smaller than 0.3, the oxidation resistance and heat resistance of the coating layer 6 are decreased. When "b" (Al content ratio) is larger than 0.6, the crystal structure of the coating layer 6 tends to change from cubic to hexagonal and thus the hardness is decreased. A particularly preferable range for "b" is $0.3 \leq b \leq 0.6$, and more preferably $0.48 \leq b \leq 0.52$. When "d" (Metal Nb content ratio) is smaller than 0.01, the oxidation resistance is reduced and the wear resistance is reduced. When "d" (Metal Nb content ratio) is larger than 0.25, the wear resistance is decreased due to the degradation of oxidation resistance or hardness. A particularly preferable range for "d" is $0.01 \leq d \leq 0.15$, and more preferably $0.04 \leq d \leq 0.1$. When "e" (Metal M content ratio) is larger than 0.25, the wear resistance is decreased due to the degradation of oxidation resistance or hardness. A particularly preferable range for "e" is $0.03 \leq e \leq 0.22$.

Alternatively, the coating layer 6 may have a multilayer structure in which a total of 10 or more first coating layers and second coating layers are alternately stacked, each first coating layer being represented by $Ti_{a1}Al_{b1}Nb_{d1}M_{e1}(C_{1-x1}N_{x1})$ (where $0 \leq a1 \leq 1$, $0 \leq b1 \leq 0.8$, $0 \leq d1 \leq 0.2$, $0 \leq e1 \leq 0.2$, and $0 \leq x1 \leq 1$) and each second coating layer being represented by $Ti_{a2}Al_{b2}Nb_{d2}M_{e2}(C_{1-x2}N_{x2})$ (where $0 \leq a2 \leq 1$, $0 \leq b2 \leq 0.8$, $0 \leq d2 \leq 0.2$, $0 \leq e2 \leq 0.2$, and $0 \leq x2 \leq 1$, but not a1=a2, b1=b2, d1=d2, and e1=e2). As a result, the hardness of the coating layer is increased, the internal stress of the coating layer reduces, and chipping and pealing are not occurred even when a thick coating layer is formed.

Non-metal components, C and N, of the coating layer 6 are good at hardness and toughness required for cutting tools and a particularly preferable range for x (N content ratio) is $0.9 \leq x \leq 1$. According to the present invention, the composition of the above-described coating layer 6 can be measured with an energy-dispersive spectroscope (EDS) or X-ray Photoelectron Spectroscopy (XPS). The composition of C and N at the flank face 4 is generally same as the composition at the rake face 3, but it may be changed by atomic ratio within a range of ±20%.

A physical vapor deposition (PVD) method such as an ion plating method or a sputtering method can be applied to form the surface coating layer 6. An arc ion plating method is preferably used as a method for forming such droplets 7 on the surface of the coating layer 6.

The Nb content ratio in the coating layer 6 at the rake face 3 is preferably larger than the Nb content ratio in the coating layer 6 at the flank face 4, in view of a balance of the wear resistance at the rake face 3 and the fracture resistance at the flank face 4.

As the substrate 2, hard alloys such as cermet and cemented carbide composed of a hard phase containing tungsten carbide or titanium carbonitride as a main component and a binder phase containing an iron-group metal such as cobalt and nickel as a main component, ceramics containing silicon nitride or aluminum oxide as a main component, and hard materials such as ultra-high pressure sintered bodies prepared by firing a hard phase composed of diamond polycrystalline or cubic boron nitride and a binder phase such as a ceramic and an iron-group metal under an ultra-high pressure.

(Production Method)

A method for producing a cutting tool according to the present invention will now be described.

First, a substrate having a tool shape is prepared by a known method. Next, a coating layer is formed on surfaces of the substrate. A physical vapor deposition (PVD) method such as an ion plating method or a sputtering method is suitable as a method for forming the coating layer. An example of the deposition method is described in detail. When the coating layer is prepared by an ion plating method, metal targets respectively independently containing metallic titanium (Ti), metallic aluminum (Al), metallic niobium, predetermined metal M (where M is at least one element selected from the group consisting of Si, W, Nb, Mo, Ta, Hf, Cr, Zr, and Y), an alloy target in which these elements are compounded, or a sintered target is used to be set at a position on a side wall of a chamber.

At this stage, according to the present invention, a main target is ste at a side wall of a chamber, the target containing a larger amount of Nb component is set at a position on the upper wall of the chamber, and the target containing a larger amount of other metal component is set at a position on the side wall of the chamber, and a film is formed by supplying arc current to each of the targets. As a result, the composition of the coating layer deposited and the composition of the droplets can be adjusted to be within the ranges of the present invention. When a sintered target prepared by a method of sintering a mixture of metal powders is used, the amount of droplets precipitating on the surface of the coating layer tends to increase compared to when an alloy target prepared by melting the metal components and re-solidifying the melted metal components is used.

Regarding the deposition conditions, a coating layer and droplets are formed by an ion plating method or a sputtering method in which metal sources are evaporated and ionized by arc discharge or glow discharge using these targets while allowing the evaporated and ionized metal sources to react with a nitrogen ($N_2$) gas as a nitrogen source, or a methane ($CH_4$)/acetylene ($C_2H_2$) gas as a carbon source. During this process, the substrate is set such that the flank faces are substantially parallel to the side surfaces of the chamber and the rake face is substantially parallel to the upper surface of the chamber. When an arc current of 100 to 200 A is supplied to the main target, an arc current of 80 to 200 A is supplied to the sub target containing a larger amount of Nb component on the side surface, and an arc current of 120 to 250 A, if desired, is supplied to the sub target on the side surface.

The composition of the droplets can be controlled to be adjusted within a predefined range by changing the states of being of each metal components evaporated in the plasma by adding a magnetic field to the arc plasma generated by a method such as one in which a magnet is arranged in a direction parallel to the direction of the target with respect to the arc plasma generated. In forming the coating layer by an ion plating method or a sputtering method, a bias voltage of 35 to 200 V is preferably applied by considering the crystal structure of the coating layer in order to prepare a coating layer having a high hardness and to increase the adhesion of the coating layer to the substrate.

Nb target and W target may include other metal components such as Ti. As a method of forming a target, when an alloy target prepared by melting the metal components and re-solidifying the melted metal components is used, the composition of the droplets precipitated on the surface of the coating layer at the rake face tends to have a higher W content ratio than that at the flank face, compared to when a sintered target prepared by a method of sintering a mixture of metal powders is used.

In order to uniformly form a coating layer during forming the coating layer 6, a film is formed during rotating a sample. Regarding the deposition conditions, a coating layer is formed by evaporating and ionizing metal sources with irradiation of arc discharge or glow discharge to an arc-ion-plating cathode at a bias voltage of 30 to 200 V and a deposition temperature of 400 to 600° C. while allowing the evaporated and ionized metal sources to react with a, i.e., nitrogen ($N_2$) gas as a nitrogen source or methane ($CH_4$)/acetylene ($C_2H_2$) gas as a carbon source flowing at a gas pressure of 2 to 5 Pa.

In order to form a coating layer having the above-described multilayer structure, two targets having different compositions, i.e., a first target having a composition close to that of the first coating layers and a second target having a composition close to that of the second coating layers, are installed to a side surface of the deposition apparatus, a W target is installed to the upper wall surface of the chamber and at a position close to the first target or the second target, and a film is formed while rotating the sample inside the apparatus.

EXAMPLE 1

Tungsten carbide (WC) powder having an average particle diameter of 0.8 μm as a main component, 10 mass % of a metallic cobalt (Co) powder having an average particle diameter of 1.2 μm, 0.1 mass % of vanadium carbide (VC) powder having an average particle diameter of 1.0 μm, and 0.3 mass % of chromium carbide ($Cr_3C_2$) powder having an average particle diameter of 1.0 μm were mixed, and the mixture was press-formed into a DCGT11T302 MFCQ throw-away-tip-shaped powder compact. The compact was subjected to a debinding treatment and fired in a 0.01 Pa vacuum at 1450° C. for 1 hour to prepare a cemented carbide. The rake face surface of each sample was polished by blasting, brushing, or the like. The resulting cemented carbide was subjected to a honing treatment by brushing.

The bias voltage shown in Table 1 were applied to the resulting substrate prepared in such a way, predefined arc currents are respectively supplied to the main target, the sub targets on the side wall and the sub target on the upper wall, a magnetic field is applied from the target direction by a permanent magnet having a ring shape embedded on the upper and bottom walls of the chamber with respect to the targets on which arc current is generated, and coating layers shown in Table 1 were formed at a deposition temperature of 540° C.

TABLE 1

| Sample No. | Main target Composition | Main target Arc current (A) | Sub target (upper wall) Composition | Sub target (upper wall) Arc current (A) | Sub target (side wall) Composition | Sub target (side wall) Arc current (A) | Deposition conditions Bias Voltage (V) | Deposition conditions Applied Magnetic Field (G) | coating layer composition at rake face |
|---|---|---|---|---|---|---|---|---|---|
| I-1 | TiAlWNbSi | 130 | AlNb | 140 | TiW | 120 | 50 | 150 | $Ti_{0.41}Al_{0.46}Nb_{0.10}W_{0.02}Si_{0.01}N$ |
| I-2 | TiAlW | 110 | AlNb | 125 | Ti | 100 | 30 | 100 | $Ti_{0.42}Al_{0.39}Nb_{0.15}W_{0.04}N$ |
| I-3 | TiNb | 150 | Nb | 180 | Ti | 180 | 100 | 80 | $Ti_{0.75}Nb_{0.25}N$ |
| I-4 | TiAlNbCr | 200 | AlCrNb | 250 | Ti | 150 | 80 | 120 | $Ti_{0.41}Al_{0.52}Nb_{0.05}Cr_{0.02}N$ |
| I-5 | TiAlY | 150 | Nb | 50 | Al | 120 | 75 | 175 | $Ti_{0.44}Al_{0.54}Nb_{0.01}Y_{0.01}N$ |
| I-6 | TiAlNb | 100 | TiNb | 150 | AlSi | 80 | 70 | 120 | $Ti_{0.50}Al_{0.44}Nb_{0.04}Si_{0.02}N$ |
| I-7 | TiAlNb | 120 | TiNb | 140 | Al | 100 | 150 | 70 | $Ti_{0.36}Al_{0.54}Nb_{0.1}C_{0.2}N_{0.8}$ |
| I-8 | TiAlWSiNb | 140 | Nb | 160 | — | | 100 | 75 | — | $Ti_{0.30}Al_{0.50}Nb_{0.10}W_{0.07}Si_{0.03}N$ |
| I-9 | TiAlNbSi | 130 | — | — | Al | 130 | 80 | 130 | $Ti_{0.42}Al_{0.52}Nb_{0.04}Si_{0.02}N$ |

For each of the resulting samples, droplets having a diameter equal to or greater than 0.3 μm on three freely selected points on a surface of each coating layer at the rake face and flank face were observed, a number of droplets of 0.3 μm or more in a diameter on a freely selected area of 10 μm×10 μm in a viewing field, an average number is calculated in five observed points. The compositions of ten droplets were measured with an energy-dispersive spectroscope (EDS) (EDAX produced by AMETEK Inc.). The averages were taken therefrom to calculate the compositions of the coating layer at the rake face and at the flank face. In the Table, average contents (atomic %) of Nb, Al and Ti for droplets formed on the rake face were respectively referred to $Nb_{DR}$, $Al_{DR}$ and $Ti_{DR}$, while average contents (atomic %) of Nb, Al and Ti for droplets formed on the flank face were respectively referred to $Nb_{DF}$, $Al_{DF}$ and $Ti_{DF}$.

Next, a cutting test was conducted by using the resulting throw-away tips having the shape of an outside turning cutting tool DCGT11T302 MFCQ under cutting conditions described below. The results are shown in Table 3.

Cutting method: outside turning
Workpiece: carbon steel (S45C)
Cutting speed: 130 m/min
Feed rate: 0.05 mm/rev
Depth of cut: 1.2 mm
Cutting condition: wet Evaluation method: The surface roughness of the workpiece was measured, using a contact-type surface roughness meter (SURFCOM produced by Tokyo Seimitsu Co., Ltd.), and an arithmetic mean roughness Ra is shown as a roughness of the work surface after 500 workpiece cutting. In addition, a number of workpieces cut until the tool life is confirmed and the wear status was observed.

TABLE 2

| | Droplets at rake face | | | | Droplets at frank face | | | | Composition ratio | | |
|---|---|---|---|---|---|---|---|---|---|---|---|
| Sample No. | Number of draplets | $Nb_{DR}$ | $Al_{DR}$ | $Ti_{DR}$ | Number of draplets | $Nb_{DF}$ | $Al_{DF}$ | $Ti_{DF}$ | $Nb_{DR}/Nb_{DF}$ | $Al_{DR}/Al_{DF}$ | $Ti_{DR}/Ti_{DF}$ |
| I-1 | 27.2 | 5.3 | 46.5 | 42.2 | 20.2 | 4.9 | 44.6 | 43.9 | 1.09 | 1.04 | 0.96 |
| I-2 | 31.1 | 25.6 | 38.6 | 42.0 | 16.6 | 24.8 | 39.0 | 49.6 | 1.03 | 0.99 | 0.85 |
| I-3 | 42.0 | 28.7 | — | 82.5 | 28.2 | 21.5 | — | 76.7 | 1.33 | — | 1.08 |
| I-4 | 26.1 | 6.3 | 52.0 | 39.8 | 22.3 | 5.9 | 49.9 | 44.1 | 1.06 | 1.04 | 0.90 |
| I-5 | 19.3 | 5.1 | 52.4 | 41.8 | 15.3 | 4.9 | 48.7 | 43.1 | 1.04 | 1.08 | 0.97 |
| I-6 | 28.3 | 8.6 | 43.1 | 50.5 | 23.8 | 7.4 | 42.3 | 54.5 | 1.16 | 1.02 | 0.93 |
| I-7 | 23.7 | 16.5 | 54.0 | 34.6 | 16.8 | 13.7 | 50.8 | 39.1 | 1.20 | 1.06 | 0.88 |
| I-8 | 27.1 | 11.0 | 51.0 | 31.5 | 31.9 | 12.7 | 49.5 | 30.2 | 0.87 | 1.03 | 1.04 |
| I-9 | 35.2 | 3.6 | 51.5 | 42.8 | 19.9 | 4.0 | 54.6 | 46.3 | 0.90 | 0.94 | 0.93 |

TABLE 3

| | | Results of cutting | | |
|---|---|---|---|---|
| Sample No. | Coating layer Composition at rake face | Finishing surface roughness (μm) | Number of cut workpieces | Condition of cutting edge |
| I-1 | $Ti_{0.42}Al_{0.47}Nb_{0.08}W_{0.02}Si_{0.01}N$ | 0.22 | 1800 | Normal wear |
| I-2 | $Ti_{0.41}Al_{0.39}Nb_{0.16}W_{0.04}N$ | 0.87 | 1160 | Normal wear |
| I-3 | $Ti_{0.75}Nb_{0.25}N$ | 1.23 | 1090 | Normal wear |
| I-4 | $Ti_{0.42}Al_{0.52}Nb_{0.04}Cr_{0.02}N$ | 0.54 | 1690 | Normal wear |
| I-5 | $Ti_{0.44}Al_{0.54}Nb_{0.01}Y_{0.01}N$ | 0.61 | 1330 | Normal wear |
| I-6 | $Ti_{0.51}Al_{0.44}Nb_{0.03}Si_{0.02}N$ | 0.43 | 1480 | Normal wear |
| I-7 | $Ti_{0.37}Al_{0.55}Nb_{0.08}C_{0.2}N_{0.8}$ | 0.62 | 1240 | Normal wear |
| I-8 | $Ti_{0.29}Al_{0.49}Nb_{0.12}W_{0.07}Si_{0.03}N$ | 1.55 | 400 | micro chipping |
| I-9 | $Ti_{0.43}Al_{0.52}Nb_{0.03}Si_{0.02}N$ | 1.61 | 700 | Welding/large wear |

Based on the results shown in Tables 1 to 3, Sample No. I-8, in which the Nb content ratio of the droplets formed at the rake face is higher than that at flank face, exhibited a high roughness of the surface of the workpiece and a short tool life, and Sample No. I-9 exhibited a lot of welding at the rake face and quickly progressed wear in a short period of time.

In contrast, Samples Nos. I-1 to I-7 within the ranges of the present invention all had good wear resistance and made a surface of the workpiece smooth, thereby achieving a good cutting performance.

EXAMPLE 2

Using the substrate in EXAMPLE 1, while a bias voltage of 50V was supplied, arc currents shown in Table 4 were supplied to the main target, the sub-target on the side wall and the sub target on the upper wall, and a magnetic field was applied from the target direction by embedding a permanent magnet having a ring shape embedded on the upper and bottom walls of the chamber with respect to the targets on which arc current is generated, the deposition temperature was set to 540° C. and the coating layers having compositions shown in Table 4 were formed. The arc current was supplied to the sub target containing a larger amount of Nb on the side surface only immediately before finishing the deposition.

TABLE 4

| Sample No. | Main target Composition | Main target Setting location | Main target Arc current (A) | Nb source target Composition | Nb source target Setting location | Nb source target Arc current (A) | W source target (only at the end of coating process) Composition | W source target Setting location | W source target Arc current (A) |
|---|---|---|---|---|---|---|---|---|---|
| II-1 | TiAlWSi | side wall | 150 | Nb | upper wall | 185 | W | side wall | 125 |
| II-2 | TiAlW | side wall | 120 | NbHf | upper wall | 135 | W | side wall | 100 |
| II-3 | TiAlNbW | side wall | 175 | Nb | upper wall | 200 | WMo | side wall | 150 |
| II-4 | TiAlNbW | side wall | 140 | NbCrSi | upper wall | 190 | W | side wall | 125 |
| II-5 | TiAlZrW | side wall | 150 | Nb | upper wall | 150 | W | side wall | 100 |
| II-6 | TiAlWY | side wall | 100 | NbY | upper wall | 110 | WY | side wall | 125 |
| II-7 | TiAlNbW | side wall | 120 | Nb | upper wall | 150 | W | side wall | 140 |
| II-8 | TiAlSiW | side wall | 150 | Nb | side wall | 145 | WSi | upper wall | 120 |
| II-9 | TiAlNbW | side wall | 120 | — | | | — | | |

For each of the resulting samples, the compositions of the coating layer and droplets at the rake face and at the flank face, and surface roughness of $R_{aR}$, $R_{ZR}$, $R_{aF}$ and $R_{ZF}$ were calculated as similar to EXAMPLE 1. The results are shown in Tables 5 and 6.

TABLE 5

| Sample No. | Composition | Rake face $Nb_{DR}$ | $W_{DR}$ | $Al_{DR}$ | $Al_{DR}/Al_{bR}$ | $Ra_R$ (μm) | $Rz_R$ (μM) |
|---|---|---|---|---|---|---|---|
| II-1 | $Ti_{0.46}Al_{0.49}Nb_{0.02}W_{0.02}Si_{0.01}N$ | 0.045 | 0.034 | 0.55 | 1.12 | 0.23 | 0.61 |
| II-2 | $Ti_{0.40}Al_{0.43}Nb_{0.1}W_{0.06}Hf_{0.01}N$ | 0.121 | 0.071 | 0.45 | 1.04 | 0.31 | 0.82 |
| II-3 | $Ti_{0.39}Al_{0.55}Nb_{0.02}W_{0.02}Mo_{0.02}N$ | 0.041 | 0.021 | 0.60 | 1.09 | 0.23 | 0.67 |
| II-4 | $Ti_{0.44}Al_{0.51}Nb_{0.01}W_{0.01}Si_{0.01}Cr_{0.02}N$ | 0.034 | 0.025 | 0.61 | 1.2 | 0.21 | 0.56 |
| II-5 | $Ti_{0.46}Al_{0.46}Nb_{0.05}W_{0.01}Zr_{0.02}N$ | 0.096 | 0.025 | 0.59 | 1.29 | 0.12 | 0.21 |
| II-6 | $Ti_{0.41}Al_{0.55}Nb_{0.01}W_{0.02}Y_{0.01}N$ | 0.013 | 0.031 | 0.61 | 1.15 | 0.28 | 0.84 |
| II-7 | $Ti_{0.37}Al_{0.53}Nb_{0.06}W_{0.04}C_{0.2}N_{0.8}$ | 0.091 | 0.040 | 0.57 | 1.07 | 0.23 | 0.51 |
| II-8 | $Ti_{0.31}Al_{0.50}Nb_{0.1}W_{0.06}Si_{0.03}N$ | 0.560 | 0.120 | 0.62 | 1.23 | 0.19 | 0.42 |
| II-9 | $Ti_{0.58}Al_{0.37}Nb_{0.04}W_{0.01}N$ | 0.041 | 0.012 | 0.58 | 1.56 | 0.29 | 0.69 |

TABLE 6

| Sample No. | Flank face $Nb_{DF}$ | $W_{DF}$ | $Ti_{DF}$ | $Ti_{DF}/Ti_{aF}$ | $Ra_F$ (μm) | $Rz_F$ (μm) | Ratio $Nb_{DR}/Nb_{DF}$ | $W_{DR}/W_{DF}$ | $(Nb_R+W_R)/(Nb_F+W_F)$ |
|---|---|---|---|---|---|---|---|---|---|
| II-1 | 0.039 | 0.041 | 0.49 | 1.07 | 0.12 | 0.24 | 1.15 | 0.83 | 0.99 |
| II-2 | 0.098 | 0.087 | 0.49 | 1.23 | 0.21 | 0.45 | 1.23 | 0.82 | 1.04 |
| II-3 | 0.036 | 0.031 | 0.45 | 1.15 | 0.13 | 0.32 | 1.14 | 0.68 | 0.93 |
| II-4 | 0.031 | 0.026 | 0.48 | 1.09 | 0.12 | 0.26 | 1.10 | 0.96 | 1.04 |
| II-5 | 0.091 | 0.031 | 0.52 | 1.12 | 0.10 | 0.41 | 1.05 | 0.81 | 0.99 |
| II-6 | 0.011 | 0.035 | 0.43 | 1.05 | 0.18 | 0.12 | 1.20 | 0.89 | 0.96 |
| II-7 | 0.085 | 0.046 | 0.37 | 1.01 | 0.13 | 0.43 | 1.07 | 0.87 | 1.00 |
| II-8 | 0.651 | 0.096 | 0.44 | 1.41 | 0.24 | 0.51 | 0.86 | 1.25 | 0.91 |
| II-9 | 0.041 | 0.012 | 0.7 | 1.21 | 0.06 | 0.15 | 1.00 | 1.00 | 1.00 |

Next, a cutting test was conducted by using the resulting throw-away tips having the same shape as EXAMPLE 1 under cutting conditions described below. The results are shown in Table 7.

Cutting method: outside turning
Workpiece: carbon steel (S45C)
Cutting speed: 100 m/min
Feed rate: 0.1 mm/rev
Depth of cut: 1.0 mm
Cutting condition: wet
Evaluation method: after 200 minutes of cutting, presence or absence of crater wear at the rake face and chipping at the flank face were observed with an optical microscope. The surface roughness of the workpiece was measured as Ra using a contact-type surface roughness meter (SURFCOM produced by Tokyo Seimitsu Co., Ltd.). The number of cutting workpieces refers to a number of workpieces which the cutting tool could cut until reaching the tool life.

TABLE 7

| | Results of cutting | | |
|---|---|---|---|
| Sample No. | Finishing surface roughness (μm) | Number of cut workpieces (mm) | Condition of cutting edge |
| II-1 | 0.11 | 1840 | Normal wear |
| II-2 | 1.23 | 852 | Find chipping |
| II-3 | 0.65 | 1310 | Normal wear |
| II-4 | 0.56 | 1400 | Normal wear |
| II-5 | 1.15 | 1012 | Slight creater wear |
| II-6 | 0.91 | 1025 | micro chipping |
| II-7 | 0.66 | 1250 | Normal wear |
| II-8 | 2.41 | 314 | large creater wear and damage |
| II-9 | 1.78 | 751 | large creater wear and chipping |

Based on the results shown in Tables 4 to 7, Sample No. II-8, in which the composition of the droplets formed at the rake face includes a low Nb content ratio and a high W content ratio compared to the composition of the droplets formed at flank face, exhibited significant creator wear occurring at the rake face and chippings occurring at the flank face. Sample No. II-9, in which the composition of the droplets formed at the rake face and the composition of the droplets formed at flank face includes the same Nb content ratio and the same W content ratio, exhibited a creator wear progressed and each samples had a short period of time.

In contrast, Samples Nos. II-1 to II-7 within the ranges of the present invention all had coating layers exhibiting a good fracture resistance and oxidation resistance, thereby achieving a good cutting performance.

EXAMPLE 3

Using cutting insert substrate of EXAMPLE 1, 3 kinds and one kind out of 4 kinds of targets shown in Table 8 are respectively mounted to the side wall and the upper wall, coating layers shown in Table 9 were deposited same as in EXAMPLE 1 on the cutting inserts substrates of Example 1. Sintered targets were used for two kinds of main targets, each of which mounted to the side wall of the chamber. Alloy targets or sintered targets of metals shown in Table 8 were used for the sub targets, one of which was mounted to the position at the wall of the chamber shown in Table 8.

TABLE 8

| | | | | | Sub target | | Sub target | | Coating condition applied | |
|---|---|---|---|---|---|---|---|---|---|---|
| | Main target 1 | | Main target 2 | | (upper wall) | | (side wall) | | Bias | magnetic |
| Sample No. | Composition | Current (A) | Composition | Current (A) | Composition | Current (A) | Composition | Current (A) | Voltage (V) | field (G) |
| III-1 | TiAlWNbSi | 100 | TiAlNb | 150 | AlNb | 140 | TiW | 120 | 50 | 150 |
| III-2 | TiAlW | 80 | TiAlNb | 130 | AlNb | 125 | Ti | 100 | 30 | 100 |
| III-3 | TiNb | 180 | TiW | 100 | Nb | 180 | Ti | 180 | 100 | 80 |

For each of the resulting inserts, same as EXAMPLE 1, results of coating layers at the rake face and the flank face was shown in Table 9. The average value of the Nb content ratios, the number of droplets on the whole surfaces of the coating layers and the average grain size. The results were shown in Table 10. Note that the first layer (upper stage) and the second layer (lower stage), which compositions were shown in Table 9, were stacked at intervals of the thickness of 10 nm or less when observing the coating layers with Transmitting Electron Microscope (TEM).

Using the resulting inserts, a cutting test was conducted under the same condition as Example 1. The results were shown in Table 11.

TABLE 9

| Sample No. | Coating layer (rake face) | | Coating layer (flank face) | |
|---|---|---|---|---|
| | Whole composition | Detail composition | Whole composition | Detail composition |
| III-1 | $Ti_{0.43}Al_{0.45}Nb_{0.105}W_{0.01}Si_{0.005}N$ | $Ti_{0.41}Al_{0.48}Nb_{0.10}W_{0.02}Si_{0.01}N$ $Ti_{0.50}Al_{0.40}Nb_{0.10}N$ | $Ti_{0.45}Al_{0.45}Nb_{0.085}W_{0.01}Si_{0.005}N$ | $Ti_{0.42}Al_{0.47}Nb_{0.08}W_{0.02}Si_{0.01}N$ $Ti_{0.52}Al_{0.39}Nb_{0.09}N$ |

TABLE 9-continued

| Sample No. | Coating layer (rake face) | | Coating layer (flank face) | |
|---|---|---|---|---|
| | Whole composition | Detail composition | Whole composition | Detail composition |
| III-2 | $Ti_{0.38}Al_{0.43}Nb_{0.17}W_{0.02}N$ | $Ti_{0.42}Al_{0.39}Nb_{0.15}W_{0.04}N$ $Ti_{0.30}Al_{0.60}Nb_{0.10}N$ | $Ti_{0.40}Al_{0.43}Nb_{0.15}W_{0.02}N$ | $Ti_{0.41}Al_{0.39}Nb_{0.16}W_{0.04}N$ $Ti_{0.33}Al_{0.58}Nb_{0.09}N$ |
| III-3 | $Ti_{0.68}Nb_{0.12}W_{0.20}N$ | $Ti_{0.75}Nb_{0.25}N$ $Ti_{0.50}W_{0.5}N$ | $Ti_{0.73}Nb_{0.13}W_{0.14}N$ | $Ti_{0.75}Nb_{0.25}N$ $Ti_{0.54}W_{0.46}N$ |

TABLE 10

| Sample No. | Droplets at rake face | | | | Droplets at frank face | | | | Composition ratio | | |
|---|---|---|---|---|---|---|---|---|---|---|---|
| | Number of droplets | $Nb_{DR}$ | $Al_{DR}$ | $Ti_{DR}$ | Number of droplets | $Nb_{DF}$ | $Al_{DF}$ | $Ti_{DF}$ | $Nb_{DR}/Nb_{DF}$ | $Al_{DR}/Al_{DF}$ | $Ti_{DR}/Ti_{DF}$ |
| III-1 | 23.7 | 8.1 | 45.5 | 43.3 | 19.8 | 7.5 | 43.6 | 46.1 | 1.09 | 1.04 | 0.96 |
| III-2 | 27.7 | 22.1 | 42.6 | 38.0 | 16.3 | 21.4 | 43.0 | 44.8 | 1.03 | 0.99 | 0.85 |
| III-3 | 30.6 | 17.8 | — | 74.8 | 25.4 | 13.4 | — | 69.6 | 1.33 | — | 1.08 |

TABLE 11

| | Results of cutting | | |
|---|---|---|---|
| Sample No. | Finishing surface roughness (·m) | Number of cut workpieces (pieces) | Condition of cutting edge |
| III-1 | 0.20 | 2000 | Normal wear |
| III-2 | 0.45 | 1330 | Normal wear |
| III-3 | 0.96 | 1210 | Normal wear |

Based on the results shown in Tables 8 to 11, Sample Nos. III-1 to III-3, in which the Nb content ratio of the droplets formed at the rake face is higher than that of the droplets formed at flank face, all had good wear resistance and made the surface of the workpiece smooth, thereby achieving a good cutting performance.

| Reference Symbols | |
|---|---|
| 1 | cutting tool |
| 2 | substrate |
| 3 | rake face |
| 4 | flank face |
| 5 | cutting edge |
| 6 | coating layer |
| 7 | droplet |

The invention claimed is:

1. A cutting tool comprising:
   a cutting tool substrate provided with a rake face and a flank face;
   a cutting edge at a ridgeline between the rake face and the flank face;
   a coating layer on surfaces of the substrate including the rake face and the flank face, wherein the coating layer comprises $Ti_aAl_bNb_dM_e(C_{1-x}N_x)$, (M being selected as at least one element from the group consisting of Si, W, Mo, Ta, Hf, Cr, Zr, and Y, in the content ranges of $0.3 \leq a \leq 0.8$, $0 \leq b \leq 0.6$, $0.01 \leq d \leq 0.25$, $0 \leq e \leq 0.25$, $a+b+d+e=1$, and $0 \leq x \leq 1$); and
   droplets on the coating layer having an Nb content ratio that is higher at the rake face than at the flank face.

2. The cutting tool according to claim 1, wherein a number of droplets at the rake face is higher than a number of droplets at the flank face.

3. The cutting tool according to claim 1, wherein the coating layer has a higher Nb content ratio at the rake face than at the flank face.

4. The cutting tool according to claim 1, wherein the coating layer comprises $Ti_aAl_bNb_dW_fM_e(C_{1-x}N_x)$, (M being selected as at least one element from the group consisting of Si, Mo, Ta, Hf, Cr, Zr, and Y, in the content ranges of $0.35 \leq a \leq 0.55$, $0.3 \leq b \leq 0.6$, $0.01 \leq d \leq 0.2$, $0 \leq e \leq 0.25$, $0 \leq f \leq 0.2$, $a+b+d+e+f=1$, and $0 \leq x \leq 1$), and a the droplets at the rake face have a lower W content than a the droplets at the flank face.

5. The cutting tool according to claim 4, wherein the ratio of an average Al content ratio $Al_{DR}$ of the droplets at the rake face to an Al content ratio $Al_{bR}$ of the coating layer at the rake face is $1.03 \leq Al_{DR}/Al_{bR} \leq 1.25$, and an average Ti content ratio $Ti_{DF}$ of the droplets at the flank face to a Ti content ratio $Ti_{aF}$ of the coating layer at the flank face is $1.03 \leq Ti_{DF}/Ti_{aF} \leq 1.2$.

6. The cutting tool according to claim 1, wherein
   $0.07 \mu m \leq Ra_R \leq 0.3 \mu m$ and $0.05 \mu m \leq Ra_F \leq 0.15 \mu m$, where an arithmetic mean surface roughness of the coating layer at the rake face is $Ra_R$ and an arithmetic mean surface roughness of the coating layer at the flank face is $Ra_F$, and
   $0.3 \mu m \leq Rz_R \leq 0.9 \mu m$ and $0.15 \mu m \leq Rz_F \leq 0.6 \mu m$, where a maximum height surface roughness of the coating layer at the rake face is $Rz_R$, and a maximum height surface roughness of the coating layer at the flank face is $Rz_F$.

7. The cutting tool according to claim 4, wherein $(Nb_R+W_R)/(Nb_F+W_F)$ is in a range between 0.9 and 1.1, where ratios of Nb and W with respect to the total amount of Ti and Al in the coating layer at the rake face are respectively $Nb_R$ and $W_R$, and ratios of Nb and W with respect to the total amount of Ti and Al in the coating layer at the flank face are respectively $Nb_F$ and $W_F$.

8. The cutting tool according to claim 1, wherein
   the coating layer has a multilayer structure that comprises first partial coating layers and second partial coating layers;
   the first partial coating layers comprise $Ti_{a1}Al_{b1}Nb_{d1}M_{e1}(C_{1-x1}N_{x1})$, in the content ranges of ($0 \leq a1 \leq 1$, $0 \leq b1 \leq 0.8$, $0 \leq d1 \leq 0.2$, $0 \leq e1 \leq 0.2$ and $0 \leq x1 \leq 1$);
   the second coating layers comprise $Ti_{a2}Al_{b2}Nb_{d2}M_{e2}(C_{1-x2}N_{x2})$, in the content ranges of ($0 \leq a2 \leq 1$, $0 \leq b2 \leq 0.8$, $0 \leq d2 \leq 0.2$, $0 \leq e2 \leq 0.2$ and $0 \leq x2 \leq 1$, excluding a1=a2, b1=b2, d1=d2, and e1=e2); and the first partial coating layers and the second partial coating layers are alternately stacked and the number of the first and second partial coating layers is ten or more.

* * * * *

UNITED STATES PATENT AND TRADEMARK OFFICE
CERTIFICATE OF CORRECTION

PATENT NO. : 8,586,214 B2
APPLICATION NO. : 13/638549
DATED : November 19, 2013
INVENTOR(S) : Yoshiki Sakamoto and Masahiro Waki It is certified that error appears in the above-identified patent and that said Letters Patent is hereby corrected as shown below:

In the Specification

Column 2, line 54 reads:

$0.01 \leq d \leq 0.2, 0 \leq e \leq 0.25, 0 \leq f \leq 0.2, a + b + d + e + f = 1$, and $0 \leq x \leq 1$), and should read:
$0.01 \leq d \leq 0.2, 0 \leq e \leq 0.25, 0 < f \leq 0.2, a + b + d + e + f = 1$, and $0 \leq x \leq 1$), Column 2, line 60 reads:

layer at the rake face may be 1.03 5 $Al_{DR}/Al_{bR} \leq 1.25$, and the and should read:

layer at the rake face may be $1.03 \leq Al_{DR}/Al_{bR} \leq 1.25$, and the

Column 3, line 1 reads:

and 0.3 μm ≤ $Rz_R$ 0.9 μm and 0.15 μm ≤ $Rz_F$ ≤ 0.6 μm, where a and should read:

and 0.3 μm ≤ $Rz_R$ ≤ 0.9 μm and 0.15 μm ≤ $Rz_F$ ≤ 0.6 μm, where a

Column 3, line 15 reads:

Signed and Sealed this
Fifteenth Day of July, 2014

Michelle K. Lee
*Deputy Director of the United States Patent and Trademark Office*

CERTIFICATE OF CORRECTION (continued)
U.S. Pat. No. 8,586,214 B2

(where $0 \leq a1 \leq 1$, $0 \leq b1 \leq 0.8$, $0 \leq d1 \leq 0.2$, $0 \leq e1 \leq 0.2$ and $0 \leq x1 \leq 1$)

and should read:

(where $0 \leq a1 \leq 1$, $0 \leq b1 \leq 0.8$, $0 < d1 \leq 0.2$, $0 \leq e1 \leq 0.2$ and $0 \leq x1 \leq 1$)

Column 4, line 33 reads:

$0.35 \leq a \leq 0.55$, $0.3 \leq b \leq 0.6$, $0.01 \leq d \leq 0.2$, $0 \leq e \leq 0.25$, $0 \leq f \leq 0.2$, and should read:

$0.35 \leq a \leq 0.55$, $0.3 \leq b \leq 0.6$, $0.01 \leq d \leq 0.2$, $0 \leq e \leq 0.25$, $0 < f \leq 0.2$, Column 5 line 17 reads:

4 preferably satisfies $1.03 \, Ti_{DF}/Ti_{aF} \leq 1.2$ relative to the conand should read:

4 preferably satisfies $1.03 \leq Ti_{DF}/Ti_{aF} \leq 1.2$ relative to the con- Column 6 line 37 reads:

(where $0 \leq a1 \leq 1$, $0 \leq b1 \leq 0.8$, $0 \leq d1 \leq 0.2$, $0 \leq e1 \leq 0.2$, and and should read:

(where $0 \leq a1 \leq 1$, $0 \leq b1 \leq 0.8$, $0 < d1 \leq 0.2$, $0 \leq e1 \leq 0.2$, and In the Claims Column 15 line 63 reads:

droplets on the coating layer having an Nb content ratio and should read:

droplets on the coating layer having an average Nb content ratio

CERTIFICATE OF CORRECTION (continued)

U.S. Pat. No. 8,586,214 B2

Column 16 line 32 reads:

a + b + d + e + f = 1, and 0x ≤ 1), and the droplets at the rake face and should read:

a + b + d+ e + f = 1, and 0 ≤ x ≤ 1), and the droplets at the rake face

Column 16 line 64 reads:

the second coating layers comprise $Ti_{a2}Al_{b2}Nb_{a2}M_{e2}(C_{1-}$ and should read:

the second coating layers comprise $Ti_{a2}Al_{b2}Nb_{d2}M_{e2}(C_{1-}$